US012730375B2

(12) United States Patent
Okada et al.

(10) Patent No.: US 12,730,375 B2
(45) Date of Patent: Sep. 8, 2026

(54) RESIST COMPOSITION AND METHOD FOR USING RESIST COMPOSITION

(71) Applicant: MITSUBISHI GAS CHEMICAL COMPANY, INC., Tokyo (JP)

(72) Inventors: Takumi Okada, Niigata (JP); Hideyuki Sato, Niigata (JP); Masayuki Katagiri, Niigata (JP); Shu Suzuki, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 782 days.

(21) Appl. No.: 17/801,462

(22) PCT Filed: Feb. 17, 2021

(86) PCT No.: PCT/JP2021/005940

§ 371 (c)(1),
(2) Date: Aug. 22, 2022

(87) PCT Pub. No.: WO2021/172132

PCT Pub. Date: Sep. 2, 2021

(65) Prior Publication Data

US 2023/0096312 A1 Mar. 30, 2023

(30) Foreign Application Priority Data

Feb. 26, 2020 (JP) ................................ 2020-030379

(51) Int. Cl.
*G03F 7/004* (2006.01)
*G03F 7/039* (2006.01)

(52) U.S. Cl.
CPC .......... *G03F 7/0048* (2013.01); *G03F 7/0392* (2013.01); *G03F 7/0397* (2013.01)

(58) Field of Classification Search
CPC ..... G03F 7/0392; G03F 7/0048; G03F 7/0397
See application file for complete search history.

(56) References Cited

U.S. PATENT DOCUMENTS 4,743,529 A * 5/1988 Farid .................... C07D 311/16 430/920
5,612,303 A 3/1997 Takayanagi et al.
7,651,834 B2 * 1/2010 Ito ......................... C07C 205/34 430/326
2004/0110085 A1 6/2004 Iwai et al.
2005/0095535 A1 5/2005 Iwai et al.
2006/0127806 A1 6/2006 Iwai et al.
2006/0127807 A1 6/2006 Iwai et al.
2006/0127808 A1 6/2006 Iwai et al.
2006/0134552 A1 6/2006 Iwai et al.
2006/0134553 A1 6/2006 Iwai et al.
2006/0177766 A1 * 8/2006 Lee ....................... G03F 7/0236 430/270.1
2007/0190455 A1 8/2007 Iwai et al.
2008/0187868 A1 * 8/2008 Padmanaban ......... G03F 7/0392 430/286.1
2010/0167206 A1 * 7/2010 Jeon ...................... G03F 7/0007 430/281.1
2011/0039206 A1 * 2/2011 Liu ....................... G03F 7/0397 560/220
2011/0294069 A1 * 12/2011 Bae ........................... G03F 7/16 430/311
2012/0171626 A1 * 7/2012 Wang .................... G03F 7/0046 430/325
2017/0090283 A1 3/2017 Jang et al.
2019/0155152 A1 * 5/2019 Aqad ...................... G03F 7/039
2019/0346764 A1 11/2019 Kamimura

FOREIGN PATENT DOCUMENTS

CN 104536265 A 4/2015
JP 7-228895 A 8/1995
JP 2002-031899 A 1/2002
JP 2003-241385 A 8/2003
JP 2007-148208 A 6/2007
JP 2017-68252 A 4/2017
KR 10-2017-0060902 A 6/2017
KR 20180039671 A * 1/2018
WO 2018/151164 A1 8/2018

OTHER PUBLICATIONS

International Search Report and Written Opinion of the International Searching Authority issued in International Patent Application No. PCT/JP2021/005940, dated Apr. 20, 2021, along with an English translation thereof.
Reconsideration Report by Examiner before Appeal issued in JP Patent Application No. 2022-503291, Jan. 20, 2026, translation.

* cited by examiner

*Primary Examiner* — John S. Chu
(74) *Attorney, Agent, or Firm* — GREENBLUM & BERNSTEIN, P.L.C.

(57) ABSTRACT

Provided is a resist composition which contains a resin (A) and a solvent (B) that contains a compound (B1) represented by general formula (b-1), wherein the content of the active ingredients based on the total amount of the resist composition is 45% by mass or less.

(b-1)

(In formula (b-1), $R^1$ represents an alkyl group having from 1 to 10 carbon atoms.)

3 Claims, No Drawings

RESIST COMPOSITION AND METHOD FOR USING RESIST COMPOSITION

TECHNICAL FIELD

The present invention relates to a resist composition and a method for using the resist composition.

BACKGROUND ART

In the production of semiconductor devices and liquid crystal devices, microfabrication is carried out by lithography using a photoresist material. In particular, in the production of semiconductor devices, further microfabrication of pattern dimensions has been desired recently with the increase in the level of integration and speed of LSI. In order to cope with such microfabrication of pattern dimensions, the light source for lithography to be used for forming a resist pattern has been changed from a KrF excimer laser (248 nm) to an ArF excimer laser (193 nm), that is, a shorter wavelength has been employed.

For example, Patent Document 1 discloses an invention related to a positive resist composition obtained by using a resin, in which a hydroxyl group in a carboxy group of (meth)acrylic acid is protected with an acid-dissociable dissolution-inhibiting group, as a photoresist material which can be applied to the formation of a resist pattern using an ArF excimer laser.

Recently, in addition to microfabrication of pattern dimensions, the development of a device having a three-dimensional structure, in which a large capacity of memory is attempted to be obtained by stacking cells, has been promoted. Further, in the production of devices having a three-dimensional structure, a resist pattern is formed after forming a thick resist film that is thicker than conventional ones.

PRIOR ART DOCUMENTS

Patent Documents

Patent Document 1: JP-A-2003-241385

SUMMARY OF THE INVENTION

Problems to be Solved by the Invention

As described above, required characteristics of a photoresist material to be used for producing various devices such as semiconductor devices and liquid crystal devices vary depending on the type of the device. For this reason, it has been desired to develop a photoresist material capable of forming a resist film suitable for the production of various devices.

Means for Solving the Problems

The present invention provides a resist composition which contains a resin and a solvent that contains a compound having a specific structure, wherein a content of active ingredients is limited to a predetermined value or less; and a method for using the resist composition.

Specifically, the present invention provides [1] to [13] below.

[1] A resist composition which contains a resin (A) and a solvent (B) that contains a compound (B1) represented by general formula (b-1), wherein a content of active ingredients based on the total amount of the resist composition is 45% by mass or less:

(b-1)

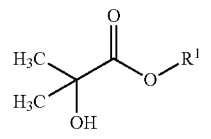

wherein in formula (b-1), $R^1$ represents an alkyl group having 1 to 10 carbon atoms.

[2] The resist composition according to item [1], which further contains at least one additive (C) selected from a photosensitizing agent and an acid generator.

[3] The resist composition according to item [1] or [2], wherein $R^1$ in general formula (b-1) is a methyl group, an ethyl group, an n-propyl group, an i-propyl group, an n-butyl group, an i-butyl group, an s-butyl group or a t-butyl group.

[4] The resist composition according to item [1] or [2], wherein $R^1$ in general formula (b-1) is an ethyl group, an n-propyl group, an i-propyl group, an n-butyl group, an i-butyl group, an s-butyl group or a t-butyl group.

[5] The resist composition according to any one of items [1] to [4], wherein the solvent (B) contains a solvent (B2) other than the compound (B1).

[6] The resist composition according to item [5], wherein the solvent (B) contains methyl α-methoxyisobutyrate as the solvent (B2).

[7] The resist composition according to any one of items [1] to [6], wherein the resin (A) contains a novolac-type resin (A1).

[8] The resist composition according to any one of items [1] to [6], wherein the resin (A) contains a resin (A2) which has at least one of a structural unit (a2-1) derived from a phenolic hydroxyl group-containing compound and a structural unit (a2-2) that may be decomposed by the action of an acid to form an acidic functional group.

[9] The resist composition according to any one of items [1] to [6], wherein the resin (A) contains a resin (A3) which has a structural unit (a3-1) having an adamantane structure.

[10] The resist composition according to item [9], wherein the resin (A3) is a copolymer which has the structural unit (a3-1) and a structural unit (a3-2) having a lactone structure.

[11] The resist composition according to item [9] or [10], wherein a content of a structural unit (a3-1α) having an adamantane structure substituted with a hydroxy group is less than 50 mol % relative to the total amount of the structural units of the resin (A3).

[12] The resist composition according to any one of items [9] to [11], wherein a content ratio of the compound (B1) in the component (B) is more than 80% by mass relative to the total amount of the component (B) contained in the resist composition.

[13] A method for using a resist composition, wherein the resist composition according to any one of items [1] to [12] is applied to the formation of a resist film.

Advantageous Effect of the Invention

When using a resist composition according to a preferred embodiment of the present invention, a resist film suitable for the production of various devices can be formed although a content of active ingredients including a resin is limited to a predetermined value or less.

BEST MODE FOR CARRYING OUT THE INVENTION

[Resist Composition]

The resist composition of the present invention contains a resin (A) (hereinafter also referred to as "the component (A)") and a solvent (B) (hereinafter also referred to as "the component (B)") that contains a compound (B1) represented by general formula (b-1).

Further, it is preferred that a resist composition according to one embodiment of the present invention further contains at least one additive (C) (hereinafter also referred to as "the component (C)") selected from a photosensitizing agent and an acid generator.

Further, in the resist composition of the present invention, a content of active ingredients is limited to 45% by mass or less based on the total amount of the resist composition (100% by mass).

In this specification, "active ingredients" mean components contained in the resist composition from which a solvent as the component (B) is excluded. Specific examples thereof include the resin (A) and the additive (C), and a substance that may be contained as another additive, which will be described later, such as an acid crosslinking agent, an acid diffusion control agent, a dissolution promoter, a dissolution control agent, a sensitizer, a surfactant, an organic carboxylic acid or a phosphorus oxoacid or a derivative thereof, a dye, a pigment, an adhesive aid, an antihalation agent, a storage stabilizer, a defoaming agent and a shape improver.

In general, in order to produce, for example, a device having a three-dimensional structure, a thick resist film must be formed, but when using a resist composition in which a content of a resin is low, it is difficult to form a thick resist film.

In this regard, the resist composition of the present invention contains the compound (B1) represented by general formula (b-1) as a solvent, and for this reason, the resist composition can be a photoresist material by which a thick resist film can be formed even when a content of active ingredients including a resin is reduced to 45% by mass or less. Further, the resist composition of the present invention has an advantage from the viewpoint of economic efficiency because the content of active ingredients is reduced to 45% by mass or less.

In a resist composition according to one embodiment of the present invention, the content of active ingredients may be suitably set according to the application to be 42% by mass or less, 40% by mass or less, 36% by mass or less, 31% by mass or less, 26% by mass or less, 23% by mass or less, 20% by mass or less, 18% by mass or less, 16% by mass or less, 12% by mass or less, 10% by mass or less, 6% by mass or less, or 3% by mass or less relative to the total amount of the resist composition (100% by mass).

Meanwhile, the lower limit of the content of active ingredients may also be suitably set according to the application, and it may be 1% by mass or more, 2% by mass or more, 4% by mass or more, 7% by mass or more, or 10% by mass or more relative to the total amount of the resist composition (100% by mass).

Note that the content of active ingredients can be defined with any combination of the upper limit and the lower limit whose values are suitably selected from among the above-described respective options.

In a resist composition according to one embodiment of the present invention, from the viewpoint of providing it as a photoresist material by which a thick resist film can be formed, a content ratio of the component (A) in active ingredients is preferably 50 to 100% by mass, more preferably 60 to 100% by mass, even more preferably 70 to 100% by mass, still more preferably 75 to 100% by mass, and particularly preferably 80 to 100% by mass relative to the total amount of active ingredients contained in the resist composition (100% by mass).

A resist composition according to one embodiment of the present invention may contain other components in addition to the components (A) to (C) according to the application.

However, in a resist composition according to one embodiment of the present invention, a total content of the components (A), (B) and (C) is preferably 30 to 100% by mass, more preferably 40 to 100% by mass, even more preferably 60 to 100% by mass, still more preferably 80 to 100% by mass, and particularly preferably 90 to 100% by mass based on the total amount of the resist composition (100% by mass).

Hereinafter, respective components contained in a resist composition according to one embodiment of the present invention will be described in detail.

<Component (A): Resin>

The resin (A) contained in a resist composition according to one embodiment of the present invention is suitably selected according to the application. In this specification, a "resin" means a polymer having a predetermined structural unit.

The weight average molecular weight (Mw) of a resin to be used in one embodiment of the present invention is preferably 1,000 to 50,000, more preferably 1,000 to 40,000, and even more preferably 1,000 to 30,000.

In the resist composition of the present invention, a content of the component (A) may be suitably set according to the application to be 45% by mass or less, 42% by mass or less, 40% by mass or less, 35% by mass or less, 31% by mass or less, 26% by mass or less, 23% by mass or less, 20% by mass or less, 18% by mass or less, 16% by mass or less, 12% by mass or less, 10% by mass or less, 6% by mass or less, or 3% by mass or less based on the total amount of the resist composition (100% by mass).

Further, the lower limit of the content of the component (A) may also be suitably set according to the application, and it may be 1% by mass or more, 2% by mass or more, 4% by mass or more, 7% by mass or more, or 10% by mass or more based on the total amount of the resist composition (100% by mass).

Note that the content of the component (A) can be defined with any combination of the upper limit and the lower limit whose values are suitably selected from among the above-described respective options.

For example, in the case of use as a photoresist material for producing a liquid crystal element, the resin (A) preferably contains a novolac-type resin (A1).

For example, in the case of use as a photoresist material for a KrF excimer laser, the resin (A) preferably contains a resin (A2) which has at least one of a structural unit (a2-1) derived from a phenolic hydroxyl group-containing compound and a structural unit (a2-2) that may be decomposed by the action of an acid to form an acidic functional group.

For example, in the case of use as a photoresist material for an ArF excimer laser, the resin (A) preferably contains a resin (A3) which has a structural unit (a3-1) having an adamantane structure.

Note that the resin (A) contained in a resist composition according to one embodiment of the present invention may contain only one selected from the resins (A1), (A2) and (A3), or may contain two or more of them in combination.

Further, the resin (A) may contain another resin other than the resins (A1), (A2) and (A3).

However, a total content ratio of the resins (A1), (A2) and (A3) in the resin (A) to be used in one embodiment of the present invention is preferably 60 to 100% by mass, more preferably 70 to 100% by mass, even more preferably 80 to 100% by mass, still more preferably 90 to 100% by mass, and particularly preferably 95 to 100% by mass relative to the total amount of the resin (A) (100% by mass).

Hereinafter, these resins (A1), (A2) and (A3) will be described.

[Novolac-Type Resin (A1)]

Examples of the novolac-type resin (A1) to be used in one embodiment of the present invention include resins obtained by reacting phenols with at least one of aldehydes and ketones in the presence of an acidic catalyst (e.g., oxalic acid).

Examples of phenols include phenol, orthocresol, metacresol, paracresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol and isothymol.

These phenols may be used solely, or two or more of them may be used in combination.

Examples of aldehydes include formaldehyde, paraformaldehyde, trioxane, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde and terephthalaldehyde.

Examples of ketones include acetone, methyl ethyl ketone, diethyl ketone and diphenyl ketone.

These aldehydes and ketones may be used solely, or two or more of them may be used in combination.

Among them, the novolac-type resin (A1) to be used in one embodiment of the present invention is preferably a resin obtained by performing a condensation reaction between a cresol and aldehydes, more preferably a resin obtained by performing a condensation reaction between at least one of metacresol and paracresol and at least one of formaldehyde and paraformaldehyde, and even more preferably a resin obtained by using metacresol and paracresol in combination and performing a condensation reaction between them and at least one of formaldehyde and paraformaldehyde.

When using metacresol and paracresol in combination, the blending ratio between metacresol and paracresol as raw materials (metacresol/paracresol, mass ratio) is preferably 10/90 to 90/10, more preferably 20/80 to 80/20, and even more preferably 50/50 to 70/30.

As the novolac-type resin (A1) to be used in one embodiment of the present invention, commercially-available products such as "EP4080G" and "EP4050G" (manufactured by Asahi Yukizai Corporation, cresol novolac resin) may be used.

The weight average molecular weight (Mw) of the novolac-type resin (A1) to be used in one embodiment of the present invention is preferably 1,000 to 30,000, more preferably 1,000 to 20,000, even more preferably 1,000 to 15,000, and still more preferably 1,000 to 10,000.

[Resin (A2)]

The resin (A2) to be used in one embodiment of the present invention is a resin which has at least one of a structural unit (a2-1) derived from a phenolic hydroxyl group-containing compound and a structural unit (a2-2) that may be decomposed by the action of an acid to form an acidic functional group, and is more preferably a copolymer having both the structural unit (a2-1) and the structural unit (a2-2).

When the resin (A2) is a resin having at least one of the structural unit (a2-1) and the structural unit (a2-2), solubility in alkaline developers can be improved thereby.

In the resin (A2) to be used in one embodiment of the present invention, a total content ratio of the structural unit (a2-1) and the structural unit (a2-2) is preferably 30 mol % or more, more preferably 50 mol % or more, even more preferably 60 mol % or more, still more preferably 70 mol % or more, and particularly preferably 80 mol % or more, and may be 85 mol % or more, 90 mol % or more, or 95 mol % or more relative to the total amount of the structural units of the resin (A2) (100 mol %).

Further, when the resin (A2) to be used in one embodiment of the present invention is a copolymer having both the structural unit (a2-1) and the structural unit (a2-2), a content ratio between the structural unit (a2-1) and the structural unit (a2-2) [(a2-1)/(a2-2), molar ratio] is preferably 1/10 to 10/1, more preferably 1/5 to 8/1, even more preferably 1/2 to 6/1, and still more preferably 1/1 to 4/1.

Examples of the phenolic hydroxyl group-containing compound constituting the structural unit (a2-1) include hydroxystyrene (o-hydroxystyrene, m-hydroxystyrene, p-hydroxystyrene) and isopropenylphenol (o-isopropenylphenol, m-isopropenylphenol, p-isopropenylphenol), and hydroxystyrene is preferred.

Examples of the acidic functional group which can be formed by decomposition of the structural unit (a2-2) by the action of an acid include a phenolic hydroxyl group and a carboxyl group.

Examples of a monomer of a structural unit which can form a phenolic hydroxyl group include: p-(1-methoxyethoxy)styrene, p-(1-ethoxyethoxy)styrene, p-(1-n-propoxyethoxy)styrene, p-(1-i-propoxyethoxy)styrene, p-(1-cyclohexyloxyethoxy)styrene, and hydroxy(α-methyl)styrenes protected by an acetal group such as α-methyl substituted derivatives thereof; and p-acetoxystyrene, t-butoxycarbonylstyrene, t-butoxystyrene, and α-methyl substituted derivatives thereof.

These substances may be used solely, or two or more of them may be used in combination.

Examples of a monomer of a structural unit which can form a carboxyl group include (meth)acrylates protected by an acid-degradable ester group such as t-butyl (meth)acrylate, tetrahydropyranyl (meth)acrylate, 2-methoxybutyl (meth)acrylate, 2-ethoxyethyl (meth)acrylate, 2-t-butoxycarbonylethyl (meth)acrylate, 2-benzyloxycarbonylethyl (meth)acrylate, 2-phenoxycarbonylethyl (meth)acrylate, 2-cyclohexyloxycarbonyl (meth)acrylate, 2-isobornyloxycarbonylethyl (meth)acrylate and 2-tricyclodecanyloxycarbonylethyl (meth)acrylate.

These substances may be used solely, or two or more of them may be used in combination.

Among them, as the monomer constituting the structural unit (a2-2), at least one selected from t-butyl (meth)acrylate, tetrahydropyranyl (meth)acrylate, 2-cyclohexyloxycarbonylethyl (meth)acrylate and p-(1-ethoxyethoxy)styrene is preferred.

It is sufficient when the resin (A2) to be used in one embodiment of the present invention is a resin having at least one of the structural unit (a2-1) and the structural unit (a2-2) as described above, but the resin (A2) may have another structural unit other than these structural units.

Examples of a monomer constituting said another structural unit include: alkyl (meth)acrylates; hydroxy group-containing monomers; epoxy group-containing monomers; alicyclic structure-containing monomers; olefins such as ethylene, propylene and isobutylene; halogenated olefins such as vinyl chloride and vinylidene chloride; diene-based monomers such as butadiene, isoprene and chloroprene; aromatic vinyl monomers such as styrene, α-methylstyrene, p-methylstyrene, p-chlorostyrene and p-methoxystyrene; cyano group-containing vinyl monomers such as (meth) acrylonitrile and vinylidene cyanide; (meth)acrylamides such as (meth)acrylamide, N,N-dimethyl (meth)acrylamide and N,N-dimethylol (meth)acrylamide; and heteroatom-containing alicyclic vinyl monomers such as (meth)acryloylmorpholine, N-vinylpyrrolidone and N-vinylcaprolactam.

Examples of the aforementioned alkyl (meth)acrylates include a compound other than the monomer constituting the structural unit (a2-2), and examples thereof include methyl (meth)acrylate, ethyl (meth)acrylate, and propyl (meth)acrylate (n-propyl (meth)acrylate, i-propyl (meth)acrylate).

Examples of the aforementioned hydroxy group-containing monomers include hydroxyalkyl (meth)acrylates such as 2-hydroxyethyl (meth)acrylate, 2-hydroxypropyl (meth) acrylate, 3-hydroxypropyl (meth)acrylate, 2-hydroxybutyl (meth)acrylate, 3-hydroxybutyl (meth)acrylate and 4-hydroxybutyl (meth)acrylate.

Note that the carbon number of an alkyl group possessed by the hydroxyalkyl (meth)acrylates is preferably 1 to 10, more preferably 1 to 8, even more preferably 1 to 6, and still more preferably 2 to 4, and the alkyl group may be either a linear alkyl group or a branched alkyl group.

Examples of the aforementioned epoxy group-containing monomers include epoxy group-containing (meth)acrylic acid esters such as glycidyl (meth)acrylate, β-methylglycidyl (meth)acrylate, (3,4-epoxycyclohexyl)methyl (meth) acrylate and 3-epoxycyclo-2-hydroxypropyl (meth)acrylate; glycidyl crotonate, and allyl glycidyl ether.

Examples of the aforementioned alicyclic structure-containing monomers include cycloalkyl (meth)acrylates such as cyclopropyl (meth)acrylate, cyclobutyl (meth)acrylate, cyclopentyl (meth)acrylate, cyclohexyl (meth)acrylate, cycloheptyl (meth)acrylate and cyclooctyl (meth)acrylate, isobornyl (meth)acrylate, and dicyclopentenyl (meth)acrylate.

Note that the resin (A2) to be used in one embodiment of the present invention may be a resin having a structural unit derived from adamantyl (meth)acrylate as the structural unit derived from the alicyclic structure-containing monomer. The resin corresponds not only to the resin (A2), but also to the resin (A3) which will be described later.

Further, the resin (A2) to be used in one embodiment of the present invention may have a structural unit derived from a monomer selected from: esters of a compound having at least two hydroxyl groups in the molecule (such as polyhydric alcohol (dihydric or higher), polyether diol and polyester diol) and (meth)acrylic acid; adducts of a compound having at least two epoxy groups in the molecule typified by epoxy resin and (meth)acrylic acid; and condensates of a compound having at least two amino groups in the molecule and (meth)acrylic acid.

Examples of the monomer include: (poly)alkylene glycol (derivative) di(meth)acrylates such as ethylene glycol di(meth)acrylate, diethylene glycol di(meth)acrylate, triethylene glycol di(meth)acrylate, propylene glycol di(meth) acrylate, dipropylene glycol di(meth)acrylate, tripropylene glycol di(meth)acrylate, butanediol di(meth)acrylate, trimethylolpropane di(meth)acrylate, trimethylolpropane tri (meth)acrylate, pentaerythritol tri(meth)acrylate, pentaerythritol tetra(meth)acrylate, tricyclodecanedimethanol di(meth)acrylate, trimethylolpropane tri(meth)acrylate, N,N'-methylenebis(meth)acrylamide, and di(meth)acrylate of ethylene glycol adduct or propyl glycol adduct of bisphenol A; and epoxy (meth)acrylates such as (meth)acrylic acid adduct of bisphenol A diglycidyl ether.

The weight average molecular weight (Mw) of the resin (A2) to be used in one embodiment of the present invention is preferably 1,000 to 50,000, more preferably 1,000 to 40,000, even more preferably 1,000 to 30,000, and still more preferably 1,000 to 25,000.

[Resin (A3)]

It is sufficient when the resin (A3) to be used in one embodiment of the present invention is a resin having a structural unit (a3-1) having an adamantane structure, but from the viewpoint of solubility in solvents and adhesiveness to substrates, practically, the resin (A3) is preferably a copolymer which has the structural unit (a3-1) and a structural unit (a3-2) having a lactone structure.

Note that at least one of hydrogen atoms to which carbon atoms constituting the adamantane structure possessed by the structural unit (a3-1) are bonded may be substituted with a substituent R.

Similarly, at least one of hydrogen atoms to which carbon atoms constituting the lactone structure possessed by the structural unit (a3-2) are bonded may be substituted with a substituent R.

Examples of the substituent R include an alkyl group having 1 to 6 carbon atoms, a hydroxyalkyl group having 1 to 6 carbon atoms, a cycloalkyl group having 3 to 6 carbon atoms, a halogen atom (fluorine atom, chlorine atom, bromine atom, iodine atom), a deuterium atom, a hydroxy group, an amino group, a nitro group, a cyano group, and a group represented by formula (i) or (ii) below.

(i)

(ii)

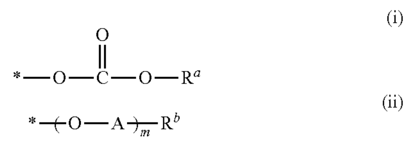

In formula (i) or (ii) above, Ra and $R^b$ each independently represent an alkyl group having 1 to 6 carbon atoms, a hydroxyalkyl group having 1 to 6 carbon atoms or a cycloalkyl group having 3 to 6 carbon atoms.

m is an integer of 1 to 10, preferably an integer of 1 to 6, more preferably an integer of 1 to 3, and even more preferably an integer of 1 to 2.

A is an alkylene group having 1 to 6 carbon atoms (preferably 1 to 4 carbon atoms, and more preferably 2 to 3 carbon atoms).

Examples of the alkylene group include a methylene group, an ethylene group, an n-propylene group, an i-propylene group, a 1,4-butylene group, a 1,3-butylene group, a tetramethylene group, a 1,5-pentylene group, a 1,4-pentylene group and a 1,3-pentylene group.

In the resin (A3) to be used in one embodiment of the present invention, a content of a structural unit (a3-1a) having an adamantane structure substituted with a hydroxy group as the structural unit (a3-1) is preferably less than 50 mol %, more preferably less than 44 mol %, even more preferably less than 39 mol %, and still more preferably less than 34 mol % relative to the total amount of the structural units of the resin (A3) (100 mol %).

In one embodiment of the present invention, the structural unit (a3-1) is preferably a structural unit (a3-1-1) represented by formula (a3-1-i) below or a structural unit (a3-1-2) represented by formula (a3-1-ii) below.

(a3-1-i)

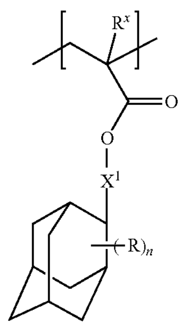

(a3-1-ii)

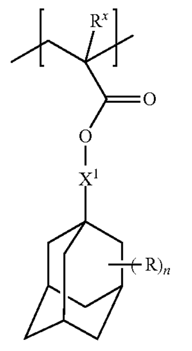

In the formulae above, ns are each independently an integer of 0 to 14, preferably an integer of 0 to 4, more preferably an integer of 0 to 2, and even more preferably an integer of 0 to 1.

$R^x$s each independently represent a hydrogen atom or a methyl group.

Rs are each independently a substituent R which the adamantane structure may possess. Specifically, it is as described above, but it is preferably an alkyl group having 1 to 6 carbon atoms, and more preferably an alkyl group having 1 to 3 carbon atoms.

$X^1$s each independently represent a single bond, an alkylene group having 1 to 6 carbon atoms, or a divalent linking group represented by any of formulae below.

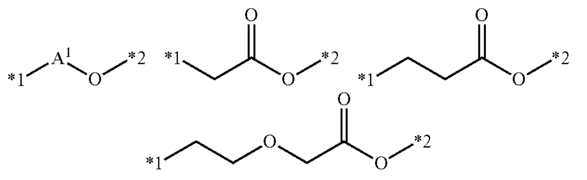

-continued

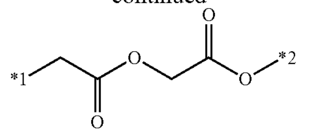

In the formulae above, *1 represents a position of bonding to an oxygen atom in formula (a3-1-i) or (a3-1-ii) above, and *2 represents a position of bonding to a carbon atom in the adamantane structure. A1 represents an alkylene group having 1 to 6 carbon atoms.

Further, in one embodiment of the present invention, the structural unit (a3-2) is preferably any of a structural unit (a3-2-1) represented by formula (a3-2-i) below, a structural unit (a3-2-2) represented by formula (a3-2-ii) below and a structural unit (a3-2-3) represented by formula (a3-2-iii) below.

(a3-2-i)

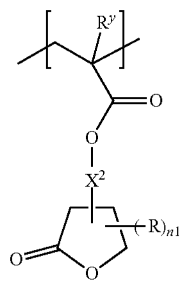

(a3-2-ii)

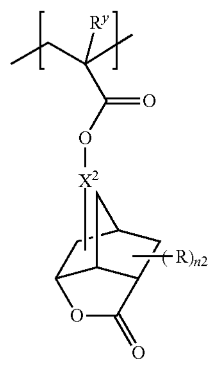

(a3-2-iii)

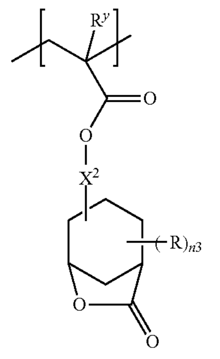

In the formulae above, n1 is an integer of 0 to 5, preferably an integer of 0 to 2, and more preferably an integer of 0 to 1.

n2 is an integer of 0 to 9, preferably an integer of 0 to 2, and more preferably an integer of 0 to 1.

n3 is an integer of 0 to 9, preferably an integer of 0 to 2, and more preferably an integer of 0 to 1.

$R^y$s represent a hydrogen atom or a methyl group.

Rs are each independently a substituent R which the lactone structure may possess. Specifically, it is as described above, but it is preferably an alkyl group having 1 to 6 carbon atoms, and more preferably an alkyl group having 1 to 3 carbon atoms. In the case where a plurality of Rs exist, said plurality of Rs may be the same group or may be groups different from each other.

$X^2$s represent a single bond, an alkylene group having 1 to 6 carbon atoms, or a divalent linking group represented by any of formulae below.

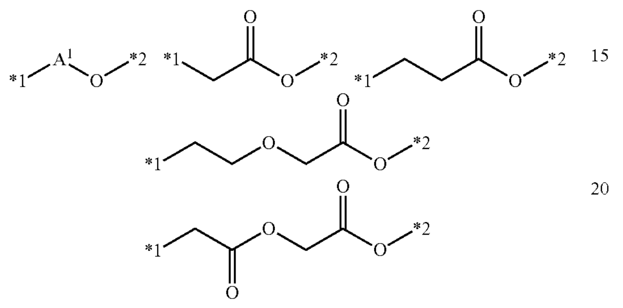

In the formulae above, *1 represents a position of bonding to an oxygen atom in formula (a3-2-i), (a3-2-ii) or (a3-2-iii) above, and *2 represents a position of bonding to a carbon atom of the lactone structure in formula (a3-2-i), (a3-2-ii) or (a3-2-iii) above. $A^1$ represents an alkylene group having 1 to 6 carbon atoms.

Note that the resin (A3) to be used in one embodiment of the present invention may have another structural unit other than the structural units (a3-1) and (a3-2).

Examples of said another structural unit include a structural unit derived from a monomer such as alkyl (meth) acrylates; hydroxy group-containing monomers; epoxy group-containing monomers; alicyclic structure-containing monomers; olefins such as ethylene, propylene and isobutylene; halogenated olefins such as vinyl chloride and vinylidene chloride; diene-based monomers such as butadiene, isoprene and chloroprene; styrene, α-methylstyrene, vinyltoluene, acrylonitrile, (meth)acrylamide, (meth)acrylonitrile, (meth)acryloylmorpholine and N-vinylpyrrolidone. The details of these monomers are the same as those described with respect to the resin (A2).

In the resin (A3) to be used in one embodiment of the present invention, a total content of the structural units (a3-1) and (a3-2) is preferably 30 to 100 mol %, more preferably 50 to 100 mol %, even more preferably 70 to 100 mol %, still more preferably 80 to 100 mol %, and particularly preferably 90 to 100 mol % relative to the total amount of the structural units of the resin (A3) (100 mol %).

The weight average molecular weight (Mw) of the resin (A3) to be used in one embodiment of the present invention is preferably 1,000 to 50,000, more preferably 2,000 to 40,000, even more preferably 3,000 to 30,000, and still more preferably 4,000 to 20,000.

The molecular weight distribution (Mw/Mn) of the resin (A3) is preferably 6.0 or less, more preferably 5.0 or less, even more preferably 4.0 or less, and still more preferably 3.2 or less, while it is preferably 1.01 or more, more preferably 1.05 or more, and even more preferably 1.1 or more.

<Component (B): Solvent>

The resist composition according to one embodiment of the present invention contains a solvent (B) that contains a compound (B1) represented by general formula (b-1) below.

As the compound (B1), one substance may be used solely, or two or more substances may be used in combination.

(b-1)

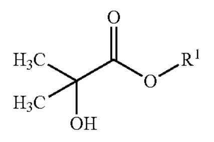

In formula (b-1) above, $R^1$ is an alkyl group having 1 to 10 carbon atoms. Note that the alkyl group may be either a linear alkyl group or a branched alkyl group.

Examples of the alkyl group that can be selected as $R^1$ include a methyl group, an ethyl group, an n-propyl group, an i-propyl group, an n-butyl group, an i-butyl group, an s-butyl group, a t-butyl group, a pentyl group, a hexyl group, a heptyl group, an octyl group, a 2-ethylhexyl group, a nonyl group and a decyl group.

Among them, in one embodiment of the present invention, $R^1$ in general formula (b-1) above is preferably a methyl group, an ethyl group, an n-propyl group, an i-propyl group, an n-butyl group, an i-butyl group, an s-butyl group or a t-butyl group, more preferably an ethyl group, an n-propyl group, an i-propyl group, an n-butyl group, an 1-butyl group, an s-butyl group or a t-butyl group, even more preferably an n-propyl group, an i-propyl group, an n-butyl group, an i-butyl group, an s-butyl group or a t-butyl group, and still more preferably an i-propyl group, an n-butyl group or an i-butyl group.

Further, in the resist composition according to one embodiment of the present invention, as the component (B), a solvent (B2) other than the compound (B1) may be contained.

Examples of the solvent (B2) include: lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; compounds having an ester bond such as ethylene glycol monoacetate, diethylene glycol monoacetate, propylene glycol monoacetate and dipropylene glycol monoacetate; compounds having an ether bond such as monoalkyl ethers or monophenyl ethers such as monomethyl ethers, monoethyl ethers, monopropyl ethers or monobutyl ethers of the polyhydric alcohols or the compounds having an ester bond; esters other than the compound (B1) such as cyclic ethers including dioxane, and methyl lactate, ethyl lactate, methyl acetate, ethyl acetate, butyl acetate, methyl pyruvate, ethyl pyruvate, methyl α-methoxyisobutyrate, methyl β-methoxyisobutyrate, ethyl 2-ethoxyisobutyrate, methyl methoxypropionate and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; and dimethyl sulfoxide (DMSO).

As the solvent (B2), these substances may be used solely, or two or more of them may be used in combination.

However, from the viewpoint of providing a photoresist material by which a thick resist film can be formed, in the resist composition of the present invention, a content ratio of the compound (B1) in the component (B) is preferably 20 to 100% by mass, more preferably 30 to 100% by mass, even more preferably 40 to 100% by mass, still more preferably 50 to 100% by mass, yet more preferably 55 to 100% by mass, still even more preferably 60 to 100% by mass, yet even more preferably 65 to 100% by mass, and particularly preferably 70 to 100% by mass, and may be 75 to 100% by mass, more than 80% by mass but 100% by mass or less, 85 to 100% by mass, 90 to 100% by mass, or 95 to 100% by mass, relative to the total amount of the component (B) contained in the resist composition (100% by mass).

Note that the content ratio of the compound (B1) in the component (B) may be suitably adjusted depending on the type of the component (A).

In the resist composition according to one embodiment of the present invention, when the component (A) contains the resin (A1), from the viewpoint of providing a photoresist material by which a thicker resist film can be formed, the content ratio of the compound (B1) in the component (B) is preferably adjusted to 20% by mass or more, 30% by mass or more, 40% by mass or more, more than 50% by mass, 55% by mass or more, 60% by mass or more, 65% by mass or more, 70% by mass or more, 75% by mass or more, more than 80% by mass, 85% by mass or more, 90% by mass or more, 95% by mass or more, 98% by mass or more, or 100% by mass relative to the total amount of the component (B) contained in the resist composition (100% by mass).

In the resist composition according to one embodiment of the present invention, when the component (A) contains the resin (A2), from the viewpoint of providing a photoresist material by which a thicker resist film can be formed, the content ratio of the compound (B1) in the component (B) is preferably adjusted to 20% by mass or more, 30% by mass or more, 40% by mass or more, more than 50% by mass, 55% by mass or more, 60% by mass or more, 65% by mass or more, 70% by mass or more, 75% by mass or more, more than 80% by mass, 85% by mass or more, 90% by mass or more, 95% by mass or more, 98% by mass or more, or 100% by mass relative to the total amount of the component (B) contained in the resist composition (100% by mass).

In the resist composition according to one embodiment of the present invention, when the component (A) contains the resin (A3), from the viewpoint of providing a photoresist material by which a thicker resist film can be formed, the content ratio of the compound (B1) in the component (B) is preferably adjusted to 20% by mass or more, 30% by mass or more, 40% by mass or more, more than 50% by mass, 55% by mass or more, 60% by mass or more, 65% by mass or more, 70% by mass or more, 75% by mass or more, more than 80% by mass, 85% by mass or more, 90% by mass or more, 95% by mass or more, 98% by mass or more, or 100% by mass relative to the total amount of the component (B) contained in the resist composition (100% by mass).

Note that the component (B) to be used in one embodiment of the present invention may contain methyl α-methoxyisobutyrate as the solvent (B2). Since methyl α-methoxyisobutyrate is a component which may be produced as a by-product in the production process of the compound (B1), the component (B) to be used in one embodiment of the present invention may contain methyl α-methoxyisobutyrate as a by-product.

The content of methyl α-methoxyisobutyrate may be less than 50% by mass, less than 40% by mass, less than 30% by mass, less than 20% by mass, less than 10% by mass, less than 5% by mass, less than 1% by mass, less than 0.1% by mass, less than 0.01% by mass, or less than 0.001% by mass based on the total amount of the resist composition (100% by mass).

The content of the component (B) in the resist composition of the present invention is suitably set according to the application, and may be 50% by mass or more, 54% by mass or more, 58% by mass or more, 60% by mass or more, 65% by mass or more, 69% by mass or more, 74% by mass or more, 77% by mass or more, 80% by mass or more, 82% by mass or more, 84% by mass or more, 88% by mass or more, 90% by mass or more, 94% by mass or more, or 97% by mass or more based on the total amount of the resist composition (100% by mass).

Further, the upper limit of the content of the component (B) is suitably set depending on the content of the component (A), and may be 99% by mass or less, 98% by mass or less, 96% by mass or less, 93% by mass or less, 91% by mass or less, 86% by mass or less, 81% by mass or less, 76% by mass or less, 71% by mass or less, 66% by mass or less, or 61% by mass or less based on the total amount of the resist composition (100% by mass).

Note that the content of the component (B) can be defined with any combination of the upper limit and the lower limit whose values are suitably selected from among the above-described respective options.

<Component (C): Additive Selected from Photosensitizing Agent and Acid Generator>

The resist composition according to one embodiment of the present invention preferably contains at least one additive (C) selected from a photosensitizing agent and an acid generator.

As the component (C), one substance may be used solely, or two or more substances may be used in combination.

In the resist composition according to one embodiment of the present invention, a content of the component (C) is preferably 0.01 to 80 parts by mass, more preferably 0.05 to 65 parts by mass, even more preferably 0.1 to 50 parts by mass, and still more preferably 0.5 to 30 parts by mass relative to 100 parts by mass of the resin (A) contained in the resist composition.

Hereinafter, the photosensitizing agent and acid generator contained as the component (C) will be described.

[Photosensitizing Agent]

The photosensitizing agent which can be selected as the component (C) is not particularly limited as long as it is generally used as a photosensitive component in a positive resist composition.

As the photosensitizing agent, one substance may be used solely, or two or more substances may be used in combination.

Examples of the photosensitizing agent to be used in one embodiment of the present invention include a reaction product of an acid chloride and a compound having a functional group (hydroxyl group, amino group or the like) that can be condensed with the acid chloride.

Examples of the acid chloride include naphthoquinone diazide sulfonic acid chloride and benzoquinone diazide sulfonic acid chloride, and specific examples thereof include 1,2-naphthoquinonediazide-5-sulfonyl chloride and 1,2-naphthoquinonediazide-4-sulfonyl chloride.

Examples of the compound having a functional group that can be condensed with the acid chloride include: hydroxybenzophenones such as hydroquinone, resorcin, 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,2',3,4,6'-pentahydroxybenzophenone; hydroxyphenylalkanes such as bis(2,4-dihydroxyphenyl)methane, bis(2,3,4-trihydroxyphenyl)methane and bis(2,4-dihydroxyphenyl)propane; and hydroxytriphenylmethanes such as 4,4',3",4"-tetrahydroxy-3,5,3',5'-tetramethyltriphenylmethane and 4,4',2",3",4"-pentahydroxy-3,5,3',5'-tetramethyltriphenylmethane.

As the photosensitizing agent to be used in one embodiment of the present invention, a commercially-available product such as "DTEP-350" (manufactured by Daito Chemix Co., Ltd., diazonaphthoquinone-type photosensitizing agent) may be used.

[Acid Generator]

Regarding the acid generator which can be selected as the component (C), it is sufficient when the acid generator is a compound which can generate an acid directly or indirectly by irradiation with radiation such as visible lights, ultraviolet rays, excimer lasers, electron beams, extreme ultraviolet rays (EUV), X-rays and ion beams.

Specific examples of preferred acid generators include a compound represented by any of general formulae (c-1) to (c-8) below.

(Compound Represented by General Formula (c-1))

(c-1)

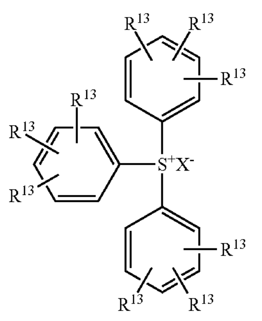

In formula (c-1) above, $R^{13}$s each independently represent a hydrogen atom, a linear, branched or cyclic alkyl group, a linear, branched or cyclic alkoxy group, a hydroxyl group or a halogen atom.

$X^-$ represents a sulfonate ion or halide ion having an alkyl group, an aryl group, a halogen-substituted alkyl group or a halogen-substituted aryl group.

The compound represented by general formula (c-1) is preferably at least one selected from the group consisting of triphenylsulfonium trifluoromethanesulfonate, triphenylsulfonium nonafluoro-n-butanesulfonate, diphenyltolylsulfonium nonafluoro-n-butanesulfonate, triphenylsul fonium perfluoro-n-octanesulfonate, diphenyl-4-methylphenylsulfonium trifluoromethanesulfonate, di-2,4,6-trimethylphenylsulfonium trifluoromethanesulfonate, diphenyl-4-t-butoxyphenylsulfonium trifluoromethanesulfonate, diphenyl-4-t-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethanesulfonate, diphenyl-4-hydroxyphenylsulfonium nonafluoro-n-butanesulfonate, bis (4-hydroxyphenyl)-phenylsulfonium trifluoromethanesulfonate, tri (4-methoxyphenyl) sulfonium trifluoromethanesulfonate, tri (4-fluorophenyl) sulfonium trifluoromethanesulfonate, triphenylsulfonium p-toluenesulfonate, triphenylsulfonium benzenesulfonate, diphenyl-2,4,6-trimethylphenyl-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium-p-toluenesulfonate, triphenylsulfonium 10-camphorsulfonate, diphenyl-4-hydroxyphenylsulfonium 10-camphorsulfonate and cyclo(1,3-perfluoropropanedisulfone) imidate.

(Compound Represented by General Formula (c-2))

(c-2)

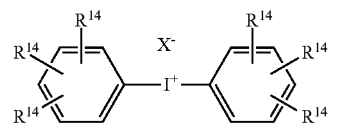

In formula (c-2) above, $R^{14}$s each independently represent a hydrogen atom, a linear, branched or cyclic alkyl group, a linear, branched or cyclic alkoxy group, a hydroxyl group or a halogen atom.

$X^-$ represents a sulfonate ion or halide ion having an alkyl group, an aryl group, a halogen-substituted alkyl group or a halogen-substituted aryl group.

The compound represented by general formula (c-2) is preferably at least one selected from the group consisting of bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium-2-trifluoromethylbenzenesulfonate, bis(4-t-butylphenyl)iodonium-4-trifluoromethylbenzenesulfonate, bis(4-t-butylphenyl)iodonium-2,4-difluorobenzenesulfonate, bis(4-t-butylphenyl)iodonium hexafluorobenzenesulfonate, bis(4-t-butylphenyl)iodonium 10-camphorsulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethylbenzenesulfonate, diphenyliodonium-4-trifluoromethylbenzenesulfonate, diphenyliodonium-2,4-difluorobenzenesulfonate, diphenyliodonium hexafluorobenzenesulfonate, di(4-trifluoromethylphenyl)iodonium trifluoromethanesulfonate, di(4-trifluoromethylphenyl)iodonium nonafluoro-n-butanesulfonate, di(4-trifluoromethylphenyl)iodonium perfluoro-n-octanesulfonate, di(4-trifluoromethylphenyl)iodonium p-toluenesulfonate, di(4-trifluoromethylphenyl)iodonium benzenesulfonate and di(4-trifluoromethylphenyl)iodonium 10-camphorsulfonate.

(Compound Represented by General Formula (c-3))

(c-3)

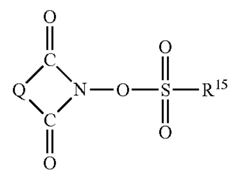

In formula (c-3) above, Q represents an alkylene group, an arylene group or an alkoxylene group. $R^{15}$ represents an alkyl group, an aryl group, a halogen-substituted alkyl group or a halogen-substituted aryl group.

The compound represented by general formula (c-3) is preferably at least one selected from the group consisting of N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)naphthylimide, N-(n-octanesulfonyloxy)bicyclo[2.2.1]hept-5-ene-2,3-dicarboximide, N-(n-octanesulfonyloxy)naphthylimide, N-(p-toluenesulfonyloxy)bicyclo[2.2.1]hept-5-ene-2,3-dicarboximide, N-(p-toluenesulfonyloxy)naphthylimide, N-(2-trifluoromethylbenzenesulfonyloxy)bicyclo[2.2.1]hept-5-ene-2,3-dicarboximide, N-(2-trifluoromethylbenzenesulfonyloxy)naphthylimide, N-(4-trifluoromethylbenzenesulfonyloxy)bicyclo[2.2.1]hept-5-ene-2,3-dicarboximide, N-(4-trifluoromethylbenzenesulfonyloxy)naphthylimide, N-(perfluorobenzenesulfonyloxy)bicyclo[2.2.1]hept-5-ene-2,3-dicarboximide, N-(perfluorobenzenesulfonyloxy)naphthylimide, N-(1-naphthalenesulfonyloxy)bicyclo[2.2.1]hept-5-ene-2,3-dicarboximide, N-(1-naphthalenesulfonyloxy)naphthylimide, N-(nonafluoro-n-butanesulfonyloxy)bicyclo[2.2.1]hept-5-ene-2,3-dicarboximide, N-(nonafluoro-n-butanesulfonyloxy)naphthylimide, N-(perfluoro-n-octanesulfonyloxy)bicyclo[2.2.1]hept-5-ene-2,3-dicarboximide and N-(perfluoro-n-octanesulfonyloxy)naphthylimide.

(Compound Represented by General Formula (c-4))

(c-4)

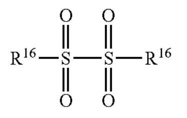

In formula (c-4) above, $R^{16}$s each independently represent a linear, branched or cyclic alkyl group, an aryl group, a heteroaryl group or an aralkyl group, and at least one of hydrogens of these groups may be substituted with any substituent.

The compound represented by general formula (c-4) is preferably at least one selected from the group consisting of diphenyl disulfone, di(4-methylphenyl)disulfone, dinaphthyl disulfone, di(4-t-butylphenyl)disulfone, di(4-hydroxyphenyl)disulfone, di(3-hydroxynaphthyl)disulfone, di(4-fluorophenyl)disulfone, di(2-fluorophenyl)disulfone and di(4-trifluoromethylphenyl)disulfone.

(Compound Represented by General Formula (c-5))

(c-5)

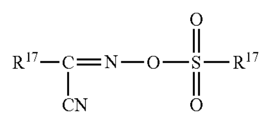

In formula (c-5) above, $R^{17}$s each independently represent a linear, branched or cyclic alkyl group, an aryl group, a heteroaryl group or an aralkyl group, and at least one of hydrogens of these groups may be substituted with any substituent.

The compound represented by general formula (c-5) is preferably at least one selected from the group consisting of α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile and α-(methylsulfonyloxyimino)-4-bromophenylacetonitrile.

(Compound Represented by General Formula (c-6))

(c-6)

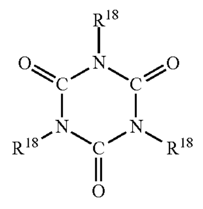

In formula (c-6) above, $R^{18}$s each independently represent a halogenated alkyl group having at least one chlorine atom and at least one bromine atom. The carbon number of the halogenated alkyl group is preferably 1 to 5.

(Compound Represented by General Formula (c-7) or (c-8))

(c-7)

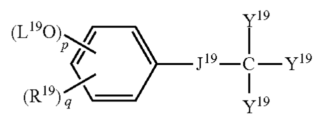

(c-8)

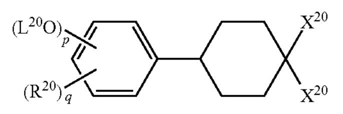

In formulae (7-7) and (7-8) above, $R^{19}$ and $R^{20}$ each independently represent an alkyl group having 1 to 3 carbon atoms (methyl group, ethyl group, n-propyl group, i-propyl group or the like), a cycloalkyl group having 3 to 6 carbon atoms (cyclopentyl group, cyclohexyl group or the like), an alkoxyl group having 1 to 3 carbon atoms (methoxy group, ethoxy group, propoxy group or the like) or an aryl group having 6 to 10 carbon atoms (phenyl group, toluyl group or naphthyl group), and are preferably an aryl group having 6 to 10 carbon atoms.

$L^{19}$ and $L^{20}$ each independently represent an organic group having a 1,2-naphthoquinonediazido group. Specifically, 1,2-quinonediazidesulfonyl groups such as 1,2-naphthoquinonediazido-4-sulfonyl group, 1,2-naphthoquinonediazido-5-sulfonyl group and 1,2-naphthoquinonediazido-6-sulfonyl group are preferred, and 1,2-naphthoquinonediazido-4-sulfonyl group or 1,2-naphthoquinonediazido-5-sulfonyl group is more preferred.

p is an integer of 1 to 3, q is an integer of 0 to 4, and $1 \le p+q \le 5$.

$J^{19}$ represents a single bond, an alkylene group having 1 to 4 carbon atoms, a cycloalkylene group having 3 to 6 carbon atoms, a phenylene group, a group represented by formula (c-7-i) below, a carbonyl group, an ester group, an amide group or —O—.

$Y^{19}$s represent a hydrogen atom, an alkyl group having 1 to 6 carbon atoms or an aryl group having 6 to 10 carbon atoms, and $X^{20}$s each independently represent a group represented by formula (c-8-i) below.

(c-7-i)

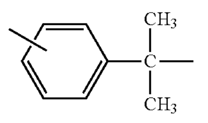

(c-8-i)

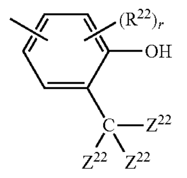

In formula (c-8-i) above, $Z^{22}$s each independently represent an alkyl group having 1 to 6 carbon atoms, a cycloalkyl group having 3 to 6 carbon atoms or an aryl group having 6 to 10 carbon atoms. $R^{22}$s each independently represent an alkyl group having 1 to 6 carbon atoms, a cycloalkyl group having 3 to 6 carbon atoms or an alkoxyl group having 1 to 6 carbon atoms, and r is an integer of 0 to 3.

As the acid generator to be used in one embodiment of the present invention, another acid generator other than the compound represented by any of general formulae (c-1) to (c-8) above may be used.

Examples of said another acid generator include: bissulfonyldiazomethanes such as bis(p-toluenesulfonyl)diazomethane, bis(2,4-dimethylphenylsulfonyl)diazomethane, bis(tert-butylsulfonyl)diazomethane, bis(n-butylsulfonyl) diazomethane, bis(isobutylsulfonyl)diazomethane, bis (isopropylsulfonyl)diazomethane, bis(n-propylsulfonyl) diazomethane, bis(cyclohexylsulfonyl)diazomethane, bis (isopropylsulfonyl)diazomethane, 1,3-bis (cyclohexylsulfonylazomethylsulfonyl) propane, 1,4-bis (phenylsulfonylazomethylsulfonyl) butane, 1,6-bis (phenylsulfonylazomethylsulfonyl) hexane and 1,10-bis (cyclohexylsulfonylazomethylsulfonyl) decane; and halogen-containing triazine derivatives such as 2-(4-methoxyphenyl)-4,6-(bistrichloromethyl)-1,3,5-triazine, 2-(4-methoxynaphthyl)-4,6-(bistrichloromethyl)-1,3,5-triazine, tris(2,3-dibromopropyl)-1,3,5-triazine and tris(2,3-dibromopropyl) isocyanurate.

<Another Additive>

The resist composition according to one embodiment of the present invention may contain another component other than the above-described components (A) to (C).

Examples of said another component include at least one selected from an acid crosslinking agent, an acid diffusion control agent, a dissolution promoter, a dissolution control agent, a sensitizer, a surfactant, an organic carboxylic acid or a phosphorus oxoacid or a derivative thereof, etc.

Note that a content of said another component (each component) is suitably selected depending on the type of the component and the type of the resin (A), but is preferably 0.001 to 100 parts by mass, more preferably 0.01 to 70 parts by mass, even more preferably 0.1 to 50 parts by mass, and still more preferably 0.3 to 30 parts by mass relative to 100 parts by mass of the resin (A) contained in the resist composition.

(Acid Crosslinking Agent)

It is sufficient when the acid crosslinking agent is a compound having a crosslinkable group capable of crosslinking the resin (A), and the acid crosslinking agent is suitably selected depending on the type of the resin (A).

Examples of the acid crosslinking agent to be used in one embodiment of the present invention include: a methylol group-containing compound such as a methylol group-containing melamine compound, a methylol group-containing benzoguanamine compound, a methylol group-containing urea compound, a methylol group-containing glycoluril compound and a methylol group-containing phenol compound; an alkoxyalkyl group-containing compound such as an alkoxyalkyl group-containing melamine compound, an alkoxyalkyl group-containing benzoguanamine compound, an alkoxyalkyl group-containing urea compound, an alkoxyalkyl group-containing glycoluril compound and an alkoxyalkyl group-containing phenol compound; a carboxymethyl group-containing compound such as a carboxymethyl group-containing melamine compound, a carboxymethyl group-containing benzoguanamine compound, a carboxymethyl group-containing urea compound, a carboxymethyl group-containing glycoluril compound and a carboxymethyl group-containing phenol compound; and an epoxy compound such as a bisphenol A-type epoxy compound, a bisphenol F-type epoxy compound, a bisphenol S-type epoxy compound, a novolac resin-type epoxy compound, a resol resin-type epoxy compound and a poly(hydroxystyrene)-type epoxy compound.

These acid crosslinking agents may be used solely, or two or more of them may be used in combination.

(Acid Diffusion Control Agent)

The acid diffusion control agent is an additive having, for example, the action of controlling diffusion of an acid that is generated from the acid generator by means of irradiation with radiation in a resist film to prevent undesirable chemical reactions in unexposed areas.

The acid diffusion control agent to be used in one embodiment of the present invention is not particularly limited, and examples thereof include a radiation-decomposable basic compound such as a nitrogen atom-containing basic compound, a basic sulfonium compound and a basic iodonium compound.

These acid diffusion control agents may be used solely, or two or more of them may be used in combination.

(Dissolution Promoter)

The dissolution promoter is an additive having the action of increasing the solubility of the resin (A) in a developing solution to adequately increase the dissolution rate of the resin (A) during development.

The dissolution promoter to be used in one embodiment of the present invention is not particularly limited, and examples thereof include a phenolic compound such as bisphenols and tris(hydroxyphenyl)methane.

These dissolution promoters may be used solely, or two or more of them may be used in combination.

(Dissolution Control Agent)

The dissolution control agent is an additive having the action of controlling the solubility of the resin (A) in a developing solution to adequately decrease the dissolution rate during development in the case where the solubility is too high.

The dissolution control agent to be used in one embodiment of the present invention is not particularly limited, and examples thereof include: aromatic hydrocarbons such as phenanthrene, anthracene and acenaphthene; ketones such as acetophenone, benzophenone and phenyl naphthyl ketone; and sulfones such as methyl phenyl sulfone, diphenyl sulfone and dinaphthyl sulfone.

These dissolution control agents may be used solely, or two or more of them may be used in combination.

(Sensitizer)

The sensitizer is an additive having the action of increasing the production amount of an acid by absorbing the energy of irradiated radiation and transferring the energy to the acid generator, thereby improving the apparent sensitivity of the resist.

Examples of the sensitizer to be used in one embodiment of the present invention include benzophenones, biacetyls, pyrenes, phenothiazines and fluorenes.

These sensitizers may be used solely, or two or more of them may be used in combination.

(Surfactant)

The surfactant is an additive having the action of improving the coating properties and striation of the resist composition, the developability of the resist, etc.

The surfactant to be used in one embodiment of the present invention may be any of an anionic surfactant, a cationic surfactant, a nonionic surfactant and an ampholytic surfactant, but a nonionic surfactant is preferred. Examples of the nonionic surfactant include polyoxyethylene higher alkyl ethers, polyoxyethylene higher alkyl phenyl ethers, and higher fatty acid diesters of polyethylene glycol.

These surfactants may be used solely, or two or more of them may be used in combination.

(Organic Carboxylic Acid or Phosphorus Oxoacid or Derivative Thereof)

The organic carboxylic acid or phosphorus oxoacid or derivative thereof is an additive having the action of preventing the deterioration of sensitivity or improving a resist pattern shape, post-exposure delay stability, etc.

The organic carboxylic acid to be used in one embodiment of the present invention is not particularly limited, and examples thereof include malonic acid, citric acid, malic acid, succinic acid, benzoic acid and salicylic acid. Examples of the phosphorus oxoacid or derivative thereof include: phosphoric acid or a derivative thereof such as an ester thereof including phosphoric acid, di-n-butyl phosphate and diphenyl phosphate; phosphonic acid or a derivative thereof such as an ester thereof including phosphonic acid, dimethyl phosphonate, di-n-butyl phosphonate, phenylphosphonic acid, diphenyl phosphonate and dibenzyl phosphonate; and phosphinic acid and a derivative thereof such as an ester thereof including phosphinic acid and phenylphosphinic acid.

These substances may be used solely, or two or more of them may be used in combination.

(Other Components)

Further, the resist composition according to one embodiment of the present invention may contain a dye, a pigment, an adhesive aid, an antihalation agent, a storage stabilizer, a defoaming agent, a shape improver, etc. in addition to the above-described another component.

[Method for Forming Resist Film]

As described above, when using the resist composition according to one embodiment of the present invention, a thick resist film suitable for the production of various devices can be formed although a content of active ingredients including a resin is limited to a predetermined value or less.

The method for forming a resist film is not particularly limited, and examples of the method include a method having the below-described step (1), and a method further having the below-described steps (2) and (3) is preferred.

Step (1): a step of applying the resist composition according to one embodiment of the present invention onto a substrate to form a coating film Step (2): a step of performing a heat treatment after the step (1)

Step (3): a step of forming a resist pattern

<Step (1)>

In the step (1), the substrate for forming a coating film is not particularly limited, and examples thereof include a substrate for electronic components and a substrate for electronic components on which a predetermined wiring pattern is formed. More specific examples thereof include a silicon wafer, a substrate made of a metal such as copper, chromium, iron and aluminum, and a glass substrate. The material of the wiring pattern is not particularly limited, and examples thereof include copper, aluminum, nickel and gold.

According to need, the substrate to be used in one embodiment of the present invention may have an underlayer film, which is formed from a material selected from an organic material and an inorganic material, on the surface of the side on which the coating film is formed. When using such a substrate having an underlayer film, the coating film is formed on the underlayer film.

Examples of the material for forming the underlayer film include a composition for forming an underlayer film described in International Publication WO2016/021511 pamphlet.

Regarding the substrate to be used in one embodiment of the present invention, according to need, the surface of the side on which the coating film is formed may be subjected to a surface treatment by applying a prewetting agent thereto.

In general, a considerable amount of a resist composition is scattered from the peripheral portion at which the peripheral speed is significantly higher when compared to the center position, and there is a problem of increase in the consumption amount of the resist composition. Regarding the problem, by applying a prewetting agent onto the surface of the substrate, the resist composition is easily diffused on the substrate, and the supply amount of the resist composition can be decreased.

Examples of the prewetting agent include cyclohexanone, ethyl lactate and methyl-3-methoxypropionate.

The specific method for performing a surface treatment using a prewetting agent is not particularly limited, and examples thereof include a method described in Japanese Laid-Open Patent Publication No. 2004-39828.

As a means for applying the resist composition onto the substrate, a publicly-known means can be suitably employed, and examples thereof include spin coating, cast coating and roll coating. As described above, a thick coating film can be formed by using the resist composition according to one embodiment of the present invention when employing such a means for application.

<Step (2)>

In one embodiment of the present invention, it is preferred that a step of heat treatment is performed as the step (2) after the step (1). By performing the heat treatment, the adhesion between the substrate and the resist film can be improved.

The heating temperature for the heat treatment in this step is suitably set depending on the composition of the resist composition, but is preferably 20 to 250° C., and more preferably 20 to 150° C.

<Step (3)>

The step (3) is a step of subjecting the formed resist film to exposure via a desired mask pattern to form a predetermined resist pattern.

Examples of radiation for irradiation at the time of exposure include visible lights, ultraviolet rays typified by i-ray (wavelength: 365 nm), far-ultraviolet rays typified by an ArF excimer laser (wavelength: 193 nm) and a KrF excimer laser (wavelength: 248 nm), excimer lasers, electron beams, extreme ultraviolet rays (EUV), X-rays typified by synchrotron radiation, and ion beams.

From the viewpoint of stably forming a high-precision fine pattern by means of exposure, the heat treatment is preferably performed after irradiation of radiation. The heating temperature for the heat treatment is preferably 20 to 250° C., and more preferably 20 to 150° C.

Next, the exposed resist film is developed using a developing solution, thereby forming a predetermined resist pattern.

As the developing solution to be used, a solvent having a solubility parameter (SP value) close to that of the resin (A) contained in the resist composition is preferably selected, and examples thereof include: apolar solvent such as a ketone-based solvent, an ester-based solvent, an alcohol-based solvent, an amide-based solvent and an ether-based solvent; a hydrocarbon-based solvent; and an alkaline aqueous solution. Examples of an alkaline compound contained in the alkaline aqueous solution include: mono-, di- or tri-alkylamines; mono-, di- or tri-alkanolamines; heterocyclic amines; tetraalkylammonium hydroxides; choline; 1,8-diazabicyclo[5,4,0]-7-undecene and 1,5-diazabicyclo[4,3,0]-5-nonene.

Examples of the development method include: a method in which a substrate is immersed in a developing solution filled in a bath for a certain period of time (dip method); a development method in which a developing solution is kept on the surface of a substrate by surface tension for a certain period of time (puddling method); a method in which a developing solution is sprayed on the surface of a substrate (spray method); and a method in which a developing solution is continuously provided and applied onto a substrate rotating at a constant rate while scanning a nozzle for providing and applying the developing solution at a constant rate (dynamic dispense method).

The development time is not particularly limited, but is preferably 10 seconds to 90 seconds.

After the development, a step of stopping the development while carrying out replacement by another solvent may be carried out.

Further, after the development, a step of washing with a rinse liquid containing an organic solvent is preferably carried out.

The rinse liquid to be used in the rinsing step after the development is not particularly limited as long as a resist pattern formed is not dissolved therein, and a solution containing a general organic solvent or water can be used.

As the aforementioned rinse liquid, a rinse liquid containing at least one organic solvent selected from hydrocarbon-based solvents, ketone-based solvents, ester-based solvents, alcohol-based solvents, amide-based solvents and ether-based solvents is preferably used.

The time for carrying out the rinsing step is not particularly limited, but is preferably 10 seconds to 90 seconds.

In the rinsing step, the substrate subjected to the development is subjected to a washing treatment using the aforementioned rinse liquid containing an organic solvent. The method for carrying out a washing treatment is not particularly limited, and examples thereof include a method in which a rinse liquid is continuously provided and applied onto a substrate rotating at a constant rate (spin-coating method), a method in which a substrate is immersed in a rinse liquid filled in a bath for a certain period of time (dip method), and a method in which a rinse liquid is sprayed on the surface of a substrate (spray method).

After forming a resist pattern, etching is carried out to obtain a pattern wiring board. As the etching method, a publicly-known method such as dry etching using plasma gas and wet etching using an alkaline solution, a cupric chloride solution, a ferric chloride solution or the like can be employed.

After forming a resist pattern, plating may be carried out. The plating method is not particularly limited, and examples thereof include copper plating, solder plating, nickel plating and gold plating.

The remaining resist pattern after etching can be stripped off by an organic solvent.

The organic solvent is not particularly limited, and examples thereof include PGMEA (propylene glycol monomethyl ether acetate), PGME (propylene glycol monomethyl ether) and EL (ethyl lactate). The stripping method is not particularly limited, and examples thereof include a dipping method and a spray method. Further, the wiring board on which the resist pattern is formed may be a multi-layered wiring board and may have small through-holes.

In this embodiment, the wiring board may be formed by a method in which a metal is vacuum-deposited after the formation of the resist pattern and then the resist pattern is dissolved by a solution, i.e., a lift-off method.

EXAMPLES

Hereinafter, the present invention will be specifically described by way of examples, but the present invention is not limited thereto. Note that measurement values in the Examples were measured using the below-described methods and apparatuses.

(1) Thickness of Coating Film

The thickness of a coating film formed from a resist composition was measured in a constant temperature and humidity room at a temperature of 23° C. and at a humidity of 50% (relative humidity) using a film thickness measurement system (device name "F20", manufactured by Filmetrics Japan, Inc.).

(2) Content Ratio of Structural Unit of Resin

In the measurement of a content ratio of a structural unit of a resin, $^{13}C$-NMR (model: "JNM-ECA500", manufactured by JEOL Ltd., 125 MHz) was used, deuterated chloroform was used as a solvent, and integration was performed 1024 times in the quantitative mode of $^{13}C$.

(3) Weight Average Molecular Weight (Mw), Number Average Molecular Weight (Mn) and Molecular Weight Distribution (Mw/Mn) of Resin Mw and Mn of a resin were measured under the below-described conditions using gel permeation chromatography (GPC) based on polystyrene as a reference material.

Device name: LaChrom series manufactured by Hitachi
Detector: RI detector L-2490
Columns: TSKgelGMHHR-M×2+Guard column HHR-H manufactured by Tosoh Corporation
Solvent: THF (containing stabilizer)
Flow rate: 1 mL/min
Column temperature: 40° C.

Further, based on Mw and Mn of the resin obtained by the measurement, the ratio [Mw/Mn] was calculated as a value of the molecular weight distribution of the resin.

Solvents used in Examples and Comparative Examples below are as described below.

<Component (B1)>

HBM: methyl 2-hydroxyisobutyrate, a compound represented by general formula (b-1) above, wherein $R^1$ is a methyl group iPHIB: isopropyl 2-hydroxyisobutyrate, a compound represented by general formula (b-1) above, wherein $R^1$ is an i-propyl group iBHIB: isobutyl 2-hydroxyisobutyrate, a compound represented by general formula (b-1) above, wherein $R^1$ is an i-butyl group nBHIB: n-butyl 2-hydroxyisobutyrate, a compound represented by general formula (b-1) above, wherein $R^1$ is an n-butyl group <Component (B2)>

PGMEA: propylene glycol monomethyl ether acetate

MMP: methyl 3-methoxypropionate nBuOAc: n-butyl acetate

EL: ethyl lactate

[Resist Composition Containing Liquid Crystal Resin]

Examples 1a to 47a, Comparative Examples 1a to 6a

As a liquid crystal resin, a cresol novolac resin obtained by mixing "EP4080G" and "EP4050G" (manufactured by Asahi Yukizai Corporation) at a mass ratio of 1:1 was used.

84 parts by mass of the cresol novolac resin and 16 parts by mass of a diazonaphthoquinone-type photosensitizing agent (trade name: "DTEP-350", manufactured by Daito Chemix Co., Ltd.) were mixed with a solvent, whose type and blending ratio are shown in Table 1, to be dissolved therein, thereby preparing a resist composition having a concentration of active ingredients (the above-described cresol novolac resin and photosensitizing agent) described in Tables 1 and 2.

Further, using the prepared resist composition, spin coating was performed on a silicon wafer at 1600 rpm to form a coating film, and the coating film was prebaked at 110° C. for 90 seconds to form a resist film. The film thickness at each of arbitrarily selected five positions on the resist film was measured, and the average value of the film thicknesses at the five positions was calculated as the average film thickness. The results are shown in Tables 1 and 2.

TABLE 1

| | Type/blending amount of solvent | | Concentration of active ingredients (% by mass) | Average film thickness (nm) |
|---|---|---|---|---|
| | Type | Blending amount (% by mass) | | |
| Example 1a | HBM | 100 | 25 | 2920 |
| Example 2a | | | 20 | 1680 |
| Example 3a | | | 18 | 1350 |
| Example 4a | | | 16 | 1050 |
| Example 5a | iPHIB | 100 | 22 | 2100 |
| Example 6a | | | 20 | 1550 |
| Example 7a | | | 18 | 1200 |
| Example 8a | iBHIB | 100 | 25 | 2850 |
| Example 9a | | | 22 | 1850 |
| Example 10a | | | 20 | 1450 |
| Example 11a | | | 18 | 1030 |
| Example 12a | nBHIB | 100 | 25 | 2450 |
| Example 13a | | | 22 | 1550 |
| Example 14a | | | 20 | 1200 |
| Comparative Example 1a | PGMEA | 100 | 25 | 1850 |
| Comparative Example 2a | | | 23 | 1480 |
| Comparative Example 3a | | | 21 | 1180 |
| Comparative Example 4a | EL | 100 | 25 | 2050 |
| Comparative Example 5a | | | 23 | 1650 |
| Comparative Example 6a | | | 21 | 1300 |

TABLE 2

| | Type/blending amount of solvent | | | | Concentration of active ingredients (% by mass) | Average film thickness (nm) |
|---|---|---|---|---|---|---|
| | Type | Blending amount (% by mass) | Type | Blending amount (% by mass) | | |
| Example 15a | HBM | 70 | PGMEA | 30 | 25 | 2560 |
| Example 16a | | | | | 22 | 1850 |
| Example 17a | | | | | 20 | 1460 |
| Example 18a | HBM | 30 | PGMEA | 70 | 25 | 2090 |
| Example 19a | | | | | 22 | 1550 |
| Example 20a | | | | | 20 | 1250 |
| Example 21a | HBM | 70 | MMP | 30 | 25 | 2390 |
| Example 22a | | | | | 22 | 1680 |
| Example 23a | | | | | 20 | 1390 |
| Example 24a | HBM | 30 | MMP | 70 | 25 | 1870 |
| Example 25a | | | | | 22 | 1360 |
| Example 26a | | | | | 20 | 1110 |
| Example 27a | HBM | 80 | nBuOAc | 20 | 25 | 2890 |
| Example 28a | | | | | 22 | 2040 |
| Example 29a | | | | | 20 | 1650 |
| Example 30a | iPHIB | 70 | PGMEA | 30 | 25 | 2450 |
| Example 31a | | | | | 22 | 1710 |
| Example 32a | | | | | 20 | 1350 |

TABLE 2-continued

| | Type/blending amount of solvent | | | | Concentration | Average |
|---|---|---|---|---|---|---|
| | Type | Blending amount (% by mass) | Type | Blending amount (% by mass) | of active ingredients (% by mass) | film thickness (nm) |
| Example 33a | iPHIB | 30 | PGMEA | 70 | 25 | 2080 |
| Example 34a | | | | | 22 | 1490 |
| Example 35a | | | | | 20 | 1190 |
| Example 36a | iBHIB | 70 | PGMEA | 30 | 25 | 2670 |
| Example 37a | | | | | 22 | 1780 |
| Example 38a | | | | | 20 | 1280 |
| Example 39a | iBHIB | 30 | PGMEA | 70 | 25 | 2060 |
| Example 40a | | | | | 22 | 1460 |
| Example 41a | | | | | 20 | 1160 |
| Example 42a | nBHIB | 70 | PGMEA | 30 | 25 | 2560 |
| Example 43a | | | | | 22 | 1600 |
| Example 44a | | | | | 20 | 1250 |
| Example 45a | nBHIB | 30 | PGMEA | 70 | 25 | 2010 |
| Example 46a | | | | | 22 | 1360 |
| Example 47a | | | | | 20 | 1130 |

It is understood from Table 1 that the resist compositions prepared in Examples 1a to 14a are capable of forming a thicker resist film when compared to the resist compositions of Comparative Examples 1b to 6b that have a concentration of active ingredients comparable to those of the resist compositions of Examples 1a to 14a.

Further, it is understood from Table 2 that the resist compositions prepared in Examples 15a to 47a are capable of forming a thick resist film though the resist compositions have a low concentration of active ingredients (20 to 25% by mass).

[Resist Composition Containing Resin for KrF]

Examples 1b to 35b, Comparative Examples 1b to 19b

As a resin for KrF, a copolymer having a structural unit derived from a mixed raw material monomer (hydroxystyrene/t-butyl acrylate=2/1 (molar ratio)) (manufactured by Maruzen Petrochemical Co., Ltd., Mw=20,000) was used.

The above-described copolymer as the resin for KrF was mixed with a mixed solvent, whose type and blending ratio are shown in Tables 3 and 4, thereby preparing a resist composition having a concentration of active ingredient (resin for KrF) described in Tables 3 and 4.

Further, using the prepared resist composition, spin coating was performed on a silicon wafer at 1600 rpm to form a coating film, and the coating film was prebaked at 110° C. for 90 seconds to form a resist film. The film thickness at each of arbitrarily selected five positions on the resist film was measured, and the average value of the film thicknesses at the five positions was calculated as the average film thickness. The results are shown in Tables 3 and 4.

TABLE 3

| | Type of solvent | Concentration of active ingredients (% by mass) | Average film thickness (nm) |
|---|---|---|---|
| Example 1b | HBM | 35 | 25700 |
| Example 2b | | 30 | 10600 |
| Example 3b | | 20 | 2430 |
| Example 4b | | 15 | 1030 |
| Example 5b | | 10 | 547 |
| Example 6b | iPHIB | 35 | 26000 |
| Example 7b | | 30 | 11000 |
| Example 8b | | 20 | 2110 |
| Example 9b | | 15 | 834 |
| Example 10b | | 10 | 436 |

TABLE 3-continued

| | Type of solvent | Concentration of active ingredients (% by mass) | Average film thickness (nm) |
|---|---|---|---|
| Example 11b | iBHIB | 35 | 35700 |
| Example 12b | | 30 | 15200 |
| Example 13b | | 20 | 2320 |
| Example 14b | | 15 | 811 |
| Example 15b | | 10 | 418 |
| Example 16b | nBHIB | 35 | 26900 |
| Example 17b | | 30 | 12300 |
| Example 18b | | 20 | 2100 |
| Example 19b | | 15 | 786 |
| Example 20b | | 10 | 400 |
| Example 27b | Mixed solvent of | 35 | 18200 |
| Example 28b | HBM/nBuOAc = 8/2 | 30 | 8470 |
| Example 29b | (mass ratio) | 20 | 2350 |
| Example 30b | | 10 | 716 |
| Example 31b | Mixed solvent of | 40 | 25000 |
| Example 32b | HBM/MMP = 5/5 | 35 | 13500 |
| Example 33b | (mass ratio) | 30 | 5680 |
| Example 34b | | 20 | 2170 |
| Example 35b | | 10 | 562 |

TABLE 4

| | Type of solvent | Concentration of active ingredients (% by mass) | Average film thickness (nm) |
|---|---|---|---|
| Comparative Example 1b | PGMEA | 40 | 21700 |
| Comparative Example 2b | | 35 | 11200 |
| Comparative Example 3b | | 30 | 5050 |
| Comparative Example 4b | | 20 | 1430 |
| Comparative Example 5b | | 15 | 555 |
| Comparative Example 6b | | 10 | 444 |
| Comparative Example 7b | MMP | 30 | 4190 |
| Comparative Example 8b | | 20 | 1350 |
| Comparative Example 9b | | 15 | 676 |
| Comparative Example 10b | | 10 | 378 |
| Comparative Example 11b | nBuOAc | 30 | 7380 |
| Comparative Example 12b | | 20 | 2070 |
| Comparative Example 13b | | 15 | 1010 |
| Comparative Example 14b | | 10 | 481 |
| Comparative Example 15b | EL | 35 | 15300 |
| Comparative Example 16b | | 30 | 7700 |
| Comparative Example 17b | | 20 | 1870 |

TABLE 4-continued

| | Type of solvent | Concentration of active ingredients (% by mass) | Average film thickness (nm) |
|---|---|---|---|
| Comparative Example 18b | | 15 | 777 |
| Comparative Example 19b | | 10 | 429 |

It is understood from Tables 3 and 4 that the resist compositions prepared in Examples 1b to 35b are capable of forming a thicker resist film when compared to the resist compositions of Comparative Examples 1b to 19b that have the same concentrations of active ingredients as those of the resist compositions of Examples 1b to 35b.

[Resist Composition Containing ArF Resin]

Synthesis Examples 1-6 (Synthesis of ArF resins (i) to (vi))

(1) Raw Material Monomer

For synthesis of ArF resins (i) to (vi), the below-described raw material monomers were used. The structures of the respective raw material monomers are as shown in Table 5.

EADM: 2-ethyl-2-adamantyl methacrylate

MADM: 2-methyl-2-adamantyl methacrylate

NML: 2-methacryloxy-4-oxatricyclo $[4.2.1.0^{3,7}]$nonane-5-one

GBLM: a-methacryloxy-γ-butyrolactone

HADM: 3-hydroxy-1-adamantyl methacrylate

TABLE 5

| Raw material monomer | EADM | MADM | NML | GBLM | HADM |
|---|---|---|---|---|---|
| Compound name | 2-ethyl-2-adamantyl methacrylate | 2-methyl-2-adamantyl methacrylate | 2-methacryloxy-4-oxatricyclo $[4.2.1.0^{3,7}]$nonane-5-one | α-methacryloxy-γ-butyrolactone | 3-hydroxy-1-adamantyl methacrylate |
| Structure | 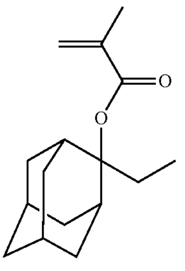 | 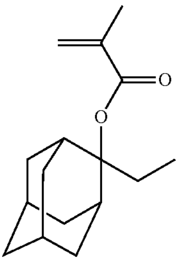 | 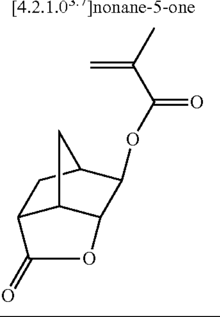 | 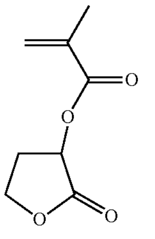 | 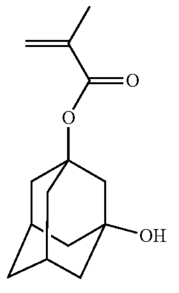 |

(2) Synthesis of ArF Resins (i) to (vi)

In a 300 mL round-bottom flask, raw material monomers, whose types are described in Table 6, were blended at a molar ratio described in Table 6 so that the total amount thereof became 10 g, then 300 g of tetrahydrofuran (manufactured by Wako Pure Chemical Industries, Ltd., special grade reagent, containing no stabilizer) was added thereto, and the mixture was stirred. After that, it was subjected to deaeration under nitrogen stream for 30 minutes. After deaeration, 0.95 g of 2,2'-azobis(isobutyronitrile) (manufactured by Tokyo Chemical Industry Co., Ltd., reagent) was added thereto, and a polymerization reaction was performed under nitrogen stream at 60° C. so that a resin having a desired molecular weight was obtained.

After the reaction was completed, the reaction solution cooled to room temperature (25° C.) was added dropwise to a large excess of hexane to precipitate a polymer. The precipitated polymer was separated by filtration, and the obtained solid was washed with methanol. After that, it was dried under reduced pressure at 50° C. for 24 hours, thereby obtaining each of the intended ArF resins (i) to (vi).

Regarding each of the obtained ArF resins (i) to (vi), based on the above-described measurement methods, a content ratio of each structural unit, and Mw, Mn and Mw/Mn were measured and calculated. The results are shown in Table 6.

TABLE 6

| | Blending ratio (molar ratio) of raw material monomer | | | | | Content ratio (mol %) of structural unit of resin | | | | | | Molecular weight of resin | | |
|---|---|---|---|---|---|---|---|---|---|---|---|---|---|---|
| ArF resin | EADM | MADM | NML | GBLM | HADM | EADM | MADM | NML | GBLM | HADM | Total | Mw | Mn | Mw/Mn |
| Resin (i) | 40 | | 40 | | 20 | 32.8 | | 38.3 | | 28.9 | 100 | 5940 | 3260 | 1.82 |
| Resin (ii) | 40 | | | 40 | 20 | 30.7 | | | 43.9 | 25.4 | 100 | 9850 | 4820 | 2.04 |

TABLE 6-continued

| | Blending ratio (molar ratio) of raw material monomer | | | | | Content ratio (mol %) of structural unit of resin | | | | | | Molecular weight of resin | | |
|---|---|---|---|---|---|---|---|---|---|---|---|---|---|---|
| ArF resin | EADM | MADM | NML | GBLM | HADM | EADM | MADM | NML | GBLM | HADM | Total | Mw | Mn | Mw/Mn |
| Resin (iii) | | 40 | 40 | | 20 | | 38.0 | 37.7 | | 24.3 | 100 | 6480 | 3160 | 2.05 |
| Resin (iv) | | 40 | | 40 | 20 | | 23.7 | | 44.9 | 31.4 | 100 | 15800 | 6820 | 2.32 |
| Resin (v) | | 40 | 40 | | 20 | | 41.6 | 33.0 | | 25.4 | 100 | 14260 | 7260 | 1.96 |
| Resin (vi) | | 40 | | 60 | | | 25.4 | | 74.6 | | 100 | 11500 | 3770 | 3.05 |

Examples 1c to 18c, Comparative Examples 1c to 12c

One of the resins for ArF (i) to (vi) obtained in Synthesis Examples 1 to 6 was mixed with a solvent, whose type is shown in Tables 7 and 8, thereby preparing a resist composition having a concentration of active ingredient (resin for ArF) described in Tables 7 and 8.

Further, using the prepared resist composition, spin coating was performed on a silicon wafer at 3000 rpm to form a coating film, and the coating film was prebaked at 90° C. for 60 seconds to form a resist film. The film thickness at each of arbitrarily selected five positions on the resist film was measured, and the average value of the film thicknesses at the five positions was calculated as the average film thickness. The results are shown in Tables 7 and 8.

TABLE 7

| | ArF resin | Type of solvent | Concentration of active ingredients (% by mass) | Average film thickness (nm) |
|---|---|---|---|---|
| Example 1c | Resin (i) | HBM | 10 | 343 |
| Example 2c | | | 5 | 131 |
| Example 3c | | | 2 | 45.7 |
| Example 4c | Resin (ii) | HBM | 10 | 373 |
| Example 5c | | | 5 | 132 |
| Example 6c | | | 2 | 42.1 |
| Example 7c | Resin (iii) | HBM | 10 | 361 |
| Example 8c | | | 5 | 142 |
| Example 9c | | | 2 | 40 |
| Example 10c | Resin (iv) | HBM | 10 | 401 |
| Example 11c | | | 5 | 142 |
| Example 12c | | | 2 | 44.7 |
| Example 13c | Resin (v) | HBM | 10 | 420 |
| Example 14c | | | 5 | 143 |
| Example 15c | | | 2 | 44.1 |
| Example 16c | Resin (vi) | HBM | 10 | 343 |
| Example 17c | | | 5 | 133 |
| Example 18c | | | 2 | 45.4 |

TABLE 8

| | ArF resin | Type of solvent | Concentration of active ingredients (% by mass) | Average film thickness (nm) |
|---|---|---|---|---|
| Comparative Example 1c | Resin (i) | PGMEA | 10 | 215 |
| Comparative Example 2c | | | 5 | 95.7 |
| Comparative Example 3c | | | 2 | 28.9 |
| Comparative Example 4c | Resin (ii) | PGMEA | 10 | 237 |
| Comparative Example 5c | | | 5 | 90.0 |
| Comparative Example 6c | | | 2 | 28.1 |

TABLE 8-continued

| | ArF resin | Type of solvent | Concentration of active ingredients (% by mass) | Average film thickness (nm) |
|---|---|---|---|---|
| Comparative Example 7c | Resin (iii) | PGMEA | 10 | 232 |
| Comparative Example 8c | | | 5 | 92.3 |
| Comparative Example 9c | | | 2 | 33.9 |
| Comparative Example 10c | Resin (iv) | PGMEA | 10 | 256 |
| Comparative Example 11c | | | 5 | 97.2 |
| Comparative Example 12c | | | 2 | 29.8 |

It is understood from Tables 7 and 8 that the resist compositions prepared in Examples 1c to 18c are capable of forming a thicker resist film when compared to the resist compositions of Comparative Examples 1c to 12c that have the same concentrations of active ingredients as those of the resist compositions of Examples 1c to 18c.

The invention claimed is:

1. A resist composition consisting of a resin (A), a solvent (B), and a photosensitizing agent (C), wherein the resin (A) consists of a novolac-type resin (A1), and the solvent (B) consists of a compound (B1) represented by general formula (b-1), wherein a content of the resin (A) and the photosensitizing agent (C) based on the total amount of the resist composition is 45% by mass or less:

(b-1)

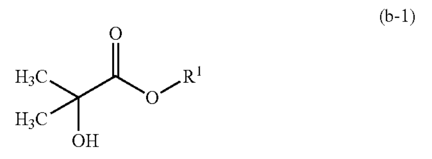

wherein in formula (b-1), $R^1$ is an n-propyl group, an i-propyl group, an n-butyl group, an i-butyl group, an s-butyl group, or a t-butyl group.

2. A method for using the resist composition, wherein the resist composition according to claim 1 is applied to the formation of a resist film.

3. A resist composition consisting of a resin (A) and a solvent (B), wherein the solvent (B) consists of a compound (B1) represented by general formula (b-1), and the resin (A) is a resin (A2) which has at least one of a structural unit (a2-1) derived from a phenolic hydroxyl group-containing compound and a structural unit (a2-2) that may be decomposed by the action of an acid to form an acidic functional group;
wherein a content of resin (A) based on the total amount of the resist composition is 45% by mass or less:
(b-1)
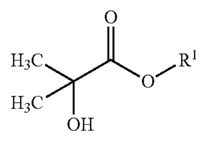
wherein in formula (b-1), $R^1$ is an n-propyl group, an i-propyl group, an n-butyl group, an i-butyl group, an s-butyl group, or a t-butyl group.
* * * * *